(12) United States Patent
Kim et al.

(10) Patent No.: US 6,492,698 B2
(45) Date of Patent: Dec. 10, 2002

(54) FLEXIBLE CIRCUIT WITH TWO STIFFENERS FOR OPTICAL MODULE PACKAGING

(75) Inventors: Brian H. Kim, Fremont; James-Yu Chang, Cupertino, both of CA (US)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 09/739,530

(22) Filed: Dec. 15, 2000

(65) Prior Publication Data

US 2002/0105042 A1 Aug. 8, 2002

(51) Int. Cl.[7] .................... H01L 31/00; H01L 31/0203
(52) U.S. Cl. .................. 257/432; 257/432; 257/433; 257/431
(58) Field of Search ................. 257/433, 696, 257/706, 918, 432, 688, 723, 724, 431, 435; 385/88, 52; 438/46, 65

(56) References Cited

U.S. PATENT DOCUMENTS 5,600,131 A * 2/1997 Miura ................. 250/214.1
6,252,298 B1 * 6/2001 Lee et al. ............... 257/668
6,316,830 B1 * 11/2001 Lin ........................ 257/737

FOREIGN PATENT DOCUMENTS

JP 405315626 A * 11/1993

* cited by examiner

Primary Examiner—Jerome Jackson, Jr.
Assistant Examiner—Joseph Nguyen

(57) ABSTRACT

Packaging for components of an optical module. The packaging includes a flexible circuit coupled to two stiffeners. The packaging has a first sub-assembly with the first stiffener for receiving a first component. The packaging also has a second sub-assembly with the second stiffener for receiving a second component and for coupling to an external circuit. The packaging has a flexible portion with a first end for coupling to the first sub-assembly and a second end for coupling to the second sub-assembly. The flexible portion allows the first sub-assembly to be oriented with respect to the second sub-assembly to form an angle that is greater than zero degrees and less than 180 degrees.

10 Claims, 8 Drawing Sheets

FLEXIBLE CIRCUIT WITH TWO STIFFENERS FOR OPTICAL MODULE PACKAGING

FIELD OF THE INVENTION

The present invention relates generally to packaging, and more particularly, to a packaging for components of an optical module that employs a flexible circuit with two stiffeners packaging.

BACKGROUND OF THE INVENTION

An optical module includes components for performing the functions of the optical module. One common optical module is the optical transmitter. The primary function of the optical transmitter is to translate electrical signals into corresponding optical signals. The major components of an optical transmitter are a laser (e.g., a vertical cavity surface emitting laser (VCSEL)) and one or more integrated circuits for driving the VCSEL and controlling the functions of the optical transmitter. The optical module interfaces with an external circuit (e.g., a printed circuit board of a switch or router) to receive data signals that need to be converted into corresponding optical signals.

As can be appreciated, the components in an optical module need to be arranged and packaged in such a manner as to efficiently interface with (1) the source of data signals, and (2) the optical medium (e.g., the fiber optic cable). One problem that the packaging must address is the bending of light.

The bending of light problem is related to the orientation of the external circuit with respect to the fiber optic cable and the optical module. The external circuit typically lies in a first plane. The optical module couples to the external circuit and is generally parallel to the first plane. Unfortunately, the VCSEL emits light in a generally perpendicular direction from the first plane, and the optical link (e.g., fiber optic cable) is generally disposed parallel to the first plane. Consequently, the light emitted from the VCSEL must be bent about 90 degrees in order to interface with the optical link. In addition to solving this problem, it is desirable for the components of the optical module to have a packaging that arranges the components in an efficient manner, that is efficient to assemble, and that can be assembled reliably across variations in process and assembling technique.

A first prior art approach packages the laser on the same plane near the other circuit components, such as the laser driver integrated circuit, in order to improve the electrical performance of the system. This approach requires optics to bend the light about ninety degrees so that the light emitted by the laser can be directed into the fiber optic cable.

Regrettably, this prior art approach suffers from several disadvantages that stem primarily from the difficulties of processing the optical components needed to bend the light by about ninety degrees. First, the components utilized to bend the light need to be optically aligned with each other and with the laser. Since the alignment can vary across different processes, alignment of these components can become a severe challenge. This disadvantage is further exacerbated when there are multiple lasers (e.g., an array of VCSELs in a parallel multichannel optical module) Second, the optical interface of each of the components must be polished and cleaned so that the loss of light through each component is minimized. Unfortunately, the polish and clean steps require added costs to the process and injects processing complexities. Consequently, there are many difficulties in assembling a package that uses optical elements to bend the output light beam.

A second prior art approach packages the laser to optically couple with the fiber optic cable without using additional optics. In order to direct the light from the laser without bending optics, the laser is placed in a plane that is generally perpendicular to the plane of the other electrical components, such as the laser driver circuit. Wires are then employed to make the 90 degree turn and to connect the laser to the laser driver.

Although the second approach avoids the difficulties of using optics to bend the light, this approach unfortunately suffers from the following disadvantages. First, the electrical performance of the wires used to connect the laser to the laser driver is often poor due to the length of the wires, thereby leading to slower signal propagation speeds. The electrical performance is of particular concern for high-speed applications. Consequently, it is desirable to decrease the length of the wires, and thus, the distance between components in the system in order to increase the speed of the signal propagation. Second, the second prior art approach typically requires three-dimensional assembly of components. Consequently, it is desirable to simplify the manufacturing and assembly process.

Furthermore, the trend is that the number of optical module component is increasing due to multiple optical transmitters or receivers being assembled into a single optical module package. Unfortunately, at the same time the physical dimensions or size of the optical module are decreasing. Consequently, there is a need for packages to address this trend and to effectively assemble these additional components in an efficient manner without sacrificing signal integrity and process or assembly efficiency.

Based on the foregoing, there remains a need for a package that conveniently couples to an external circuit disposed in a first plane, that houses a laser and electronic components, and that ensures that light transmitted from the laser is oriented in a direction that is generally parallel to the first plane and that overcomes the disadvantages set forth previously.

SUMMARY OF THE INVENTION

According to one embodiment of the present invention, a packaging for components of an optical module is provided. The packaging includes a flexible circuit coupled to two stiffeners. The packaging has a first sub-assembly with the first stiffener for receiving a first component (e.g., a VCSEL laser array and an associated laser driver circuit). The packaging also has a second sub-assembly with the second stiffener for receiving a second component (e.g., a memory circuit) and for coupling to an external circuit (e.g., a printed circuit board of a network device). The packaging has a flexible portion with a first end for coupling the first sub-assembly and a second end for coupling to the second sub-assembly. The flexible portion allows the first sub-assembly to be oriented with respect to the second sub-assembly to form an angle that is greater than zero degrees and less than 180 degrees.

According to one aspect of the present invention, the packaging provides a mechanism (e.g., a flexible portion) for allowing or enabling a laser to emit light with an orientation that is generally parallel to the plane of an external circuit without optics for bending the light.

According to another aspect of the present invention, the packaging of the present invention includes a flexible circuit coupled to two stiffeners. The packaging includes a first sub-assembly having an integrated circuit receiving area that can receive a first integrated circuit and a second sub-assembly having an integrated circuit receiving area that can receive a second integrated circuit. A flexible circuit has at least one conductive trace to communicate signals between first integrated circuit in the first sub-assembly and the second integrated circuit in the second sub-assembly.

In the preferred embodiment, the first sub-assembly packages a VCSEL array and a VCSEL driver and the second sub-assembly packages a memory (e.g., an EEPROM) and provides a connection (e.g., BGA solder bumps) to an external circuit. The first and second stiffeners are fixably secured to a first and second surface of a heat sink in such a manner as to orient the first sub-assembly with respect to the second sub-assembly to form an angle of about 90 degrees. This arrangement disposes the VCSEL array in close proximity to the VCSEL driver so that the electrical performance and signal propagation speed are enhanced. Furthermore, this arrangement allows light to be directed from the laser array to the fiber optic cable without the need for optics for bending the light.

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION OF THE PREFERRED EMBODIMENT

A packaging for optical module components that uses a flexible circuit and two stiffeners and method for assembling the same are described. In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

Networking Device 100

Figure 1:
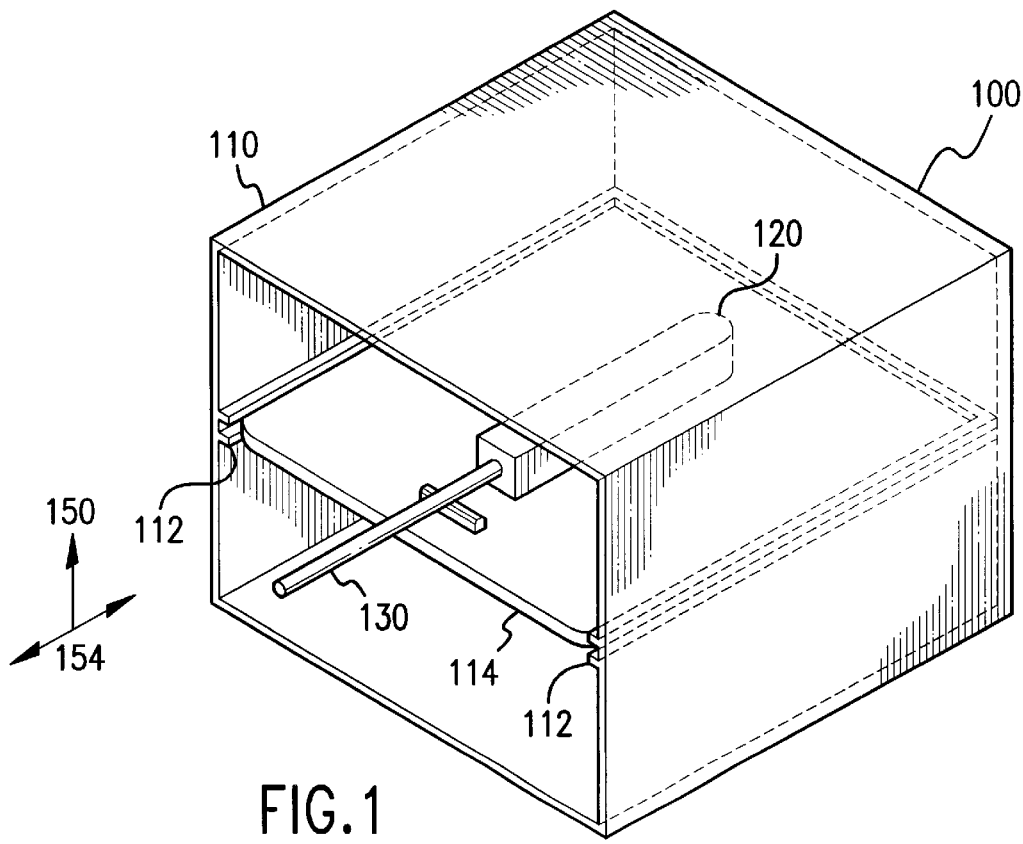
FIG. 1 is a block diagram of a networking device that has a plurality of optical modules where each module can utilize the packaging of the present invention.

FIG. 1 is a block diagram of a networking device 100 in which the present invention can be employed. The networking device 100 can be, for example, a router, a switch, or other networking device. The networking device 100 includes a chassis 110 with a plurality of guide channels 112 for receiving printed circuit boards (PCBs) and other system components. For example, a first printed circuit board 114 can be slidably mounted to the chassis 110 by employing a set of guide channels disposed opposite from each other along the side walls of the chassis 110. It is noted that another guide channel can be employed on A another side wall to provide additional mechanical support and/or provide electrical or optical coupling with respective components. that is disposed on the bottom surface 110. The main printed circuit board 114 includes circuits for performing the networking functions corresponding to the fiction of the networking device.

The main printed circuit board 114 also includes a plurality of optical modules 120. The optical modules 120 include optical transmitters for translating the electrical output signals provided by the main printed circuit board 114 into optical signals for transmission across a light conducting medium 130 (e.g., fiber optic cables). The optical modules 120 also can include optical receivers for receiving optical signals from the light conducting medium 130 (e.g., fiber optic cables) and for translating the received optical signals into corresponding electrical output signals and providing these signals to the main printed circuit board 114. The optical modules 120 can also include optical transceivers that both translate electrical signals into optical signals for transmission and received optical signals into electrical signals for processing. An exemplary optical module 120 is described in greater detail hereinafter with reference to FIG. 2.

As described previously, one challenge faced by the prior art approaches is how to optically bend the light that is generally directed in an vertical orientation 150 (e.g., up or down) into light that is generally directed in an horizontal orientation 154 (e.g., a direction generally parallel to the plane of the main printed circuit board 114). One aspect of the present invention is the use of a flexible circuit with two stiffeners to "bend" electrical signals so that the laser (e.g., VCSEL) can be oriented to directly emit light in a horizontal orientation that is generally perpendicular to the plane of the main printed circuit board 114.

Optical Module 120

Figure 2:
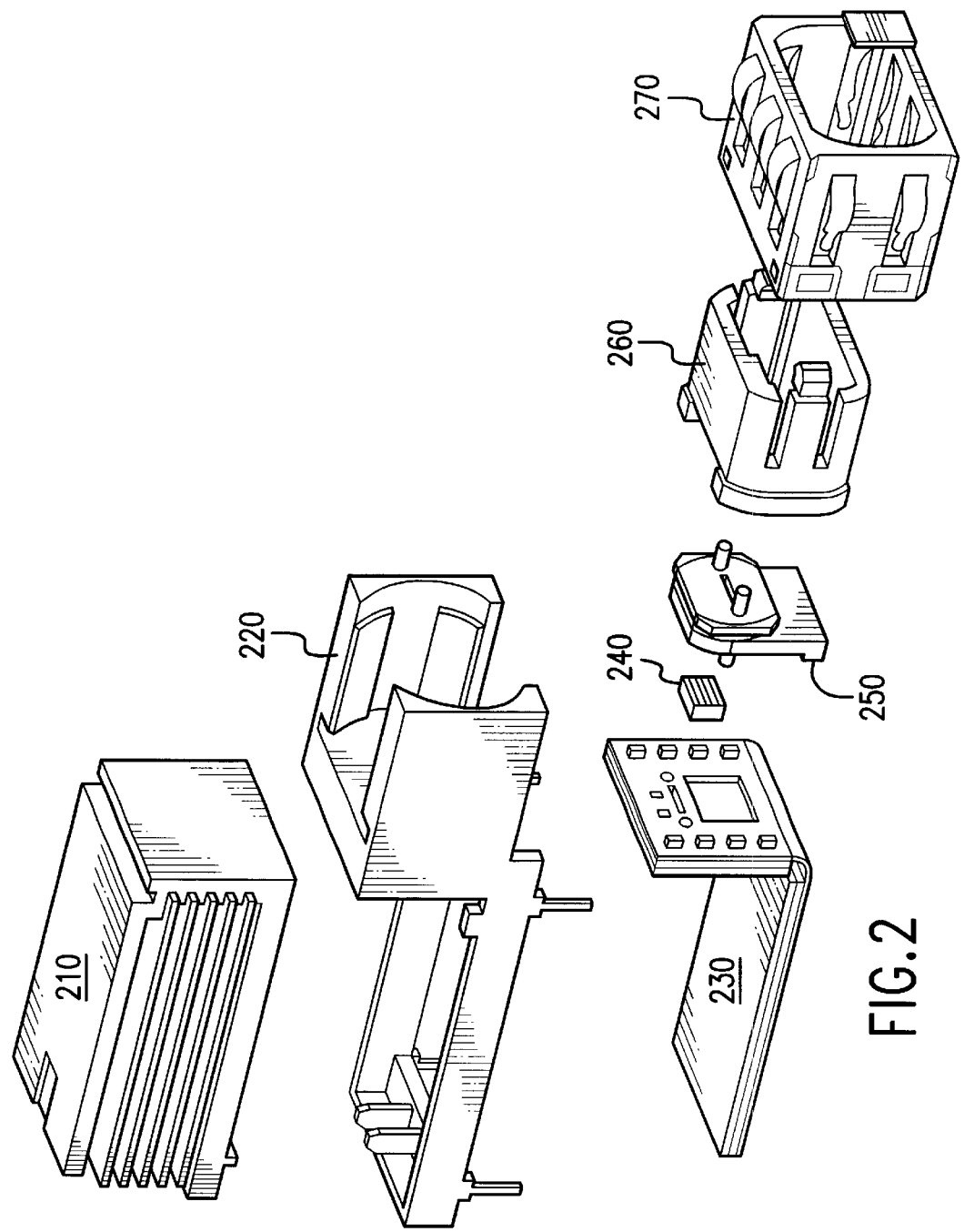
FIG. 2 is an exploded perspective view of an exemplary optical module in which the sub-assembly packaging of the present invention can be employed.

FIG. 2 is an exploded perspective view of an exemplary optical module in which the sub-assembly packaging 230 of the present invention can be employed. The optical module 120 has various components that need to be packaged. As described earlier, the packaging must ensure that the transmitted light is generally parallel to the plane of the printed circuit board of the network device and at the same time accommodate the increasing number of components, especially in a multiple channel (e.g., 12 channel) parallel optical module that includes an array of lasers.

The optical module 120 can be, but is not limited to, an optical receiver module for providing optical receiving functionality, an optical transmitter module for providing optical transmitting functionality, and an optical transceiver module for providing both optical receiving functionality and optical transmitting functionality.

In this exemplary embodiment, the optical module 120 includes a heat sink 210, a housing 220, which can be made of a die cast metal, a sub-assembly packaging 230 of the present invention, a lens 240, a lens alignment element 250, a receptacle 260, and an EMI ground clip 270. The sub-assembly packaging 230 includes a flexible circuit coupled to two fasteners and is described in greater detail hereinafter with reference to FIG. 3.

Flexible Circuit with Two Stiffeners

Figure 3:
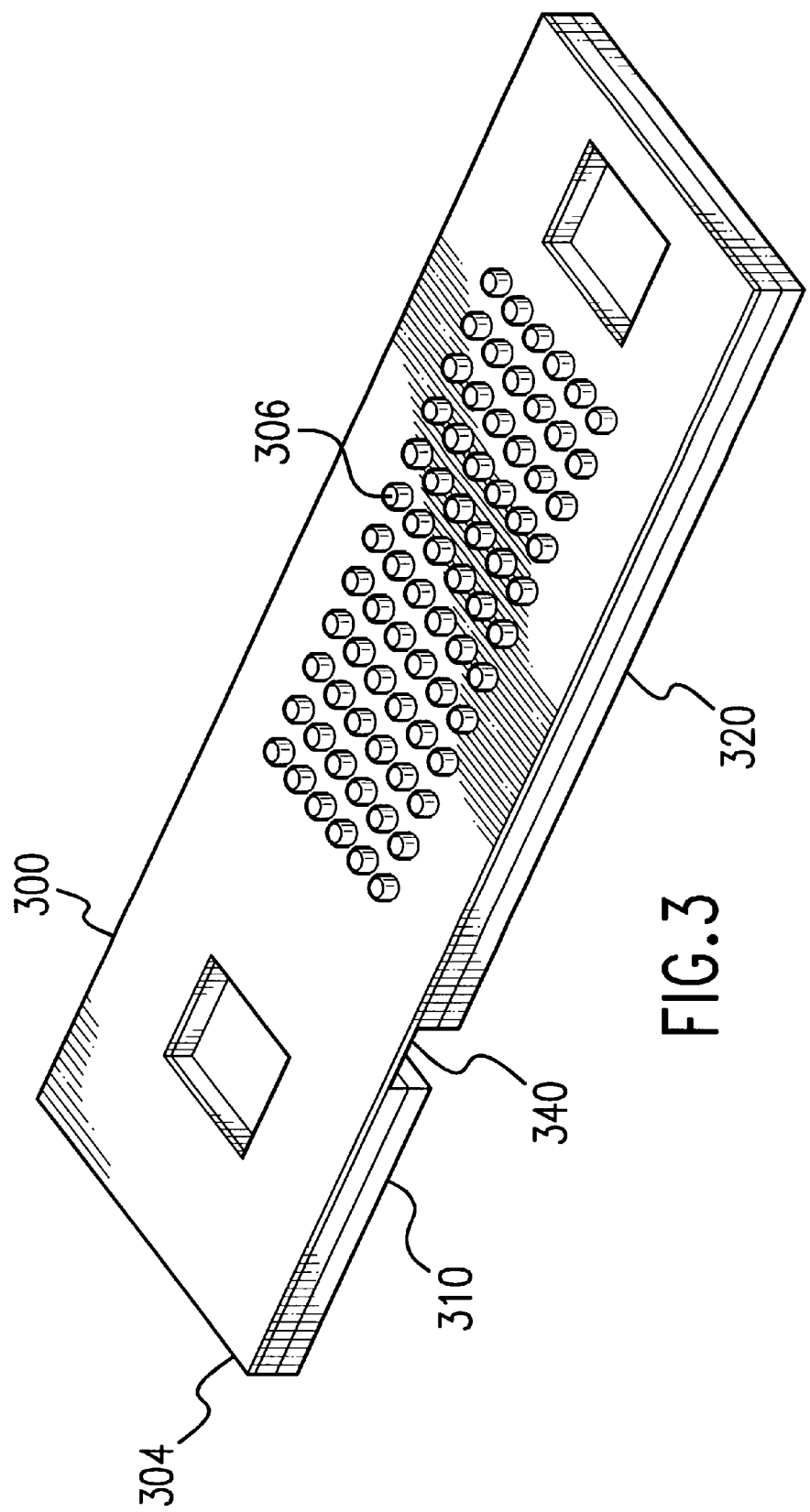
FIG. 3 is a perspective view of a substrate having a flexible circuit, a first stiffener and a second stiffener in accordance with one embodiment of the present invention.

FIG. 3 is a perspective view of a substrate 300 in accordance with one embodiment of the present invention. The substrate 300 includes a flexible circuit 304 (herein after also referred to as "flex") that is coupled to two stiffeners. The substrate 300 further includes a first surface, a second surface, and a bending portion 340. For example, the flexible circuit 304 can be a tape ball grid array flexible circuit (TBGA flex).

The flexible circuit 304 is a flexible material having one or more layers, where the flexible material has conductive traces embedded therein for the communication of electric signals. For example, the flexible circuit 304 can be made of a flexible material (e.g., a polyimide material). The construction and use of the flexible circuit 304 are well-known to those of ordinary skill in the art.

The first surface includes a connection area 306 for electrically coupling to the printed circuit board 114. The connection area 306 can have interconnect (e.g., a ball grid array (BGA)), for coupling to the printed circuit board 114. It is noted that other conductors or electrodes can be employed to provide an electrical connection with the printed circuit board 114.

One aspect of the present invention is the combination of a flexible circuit 304 with two stiffeners 310, 320. The second surface (e.g., bottom surface) of the flexible circuit 304 can include a first stiffener receiving area and a second stiffener receiving area. The substrate 300 further includes a first stiffener 310 that is coupled to the first stiffener receiving area, and a second stiffener 320 that is coupled to the second stiffener receiving area. Preferably, the first stiffener 310 and second stiffener 320 are fixably secured to the flex through the use of an adhesive, such as glue or tacky material.

The first and second stiffeners 310, 320 serve as thermal paths through which heat generated by optical and electrical components in the sub-assembly may be dissipated. The use of the first and second stiffeners 310, 320 in conjunction with a heat sink to facilitate in heat dissipation is described in greater detail hereinafter with reference to FIGS. 6 and 7.

The first and second stiffeners 310, 320 can be made of any conductive material, such as copper and may each include one or more layers of conductive materials. In this embodiment, the stiffeners 310, 320 each have two layers. However, it is to be appreciated that the number of layers can be modified to suit the requirements of a particular application.

The flexible circuit 304 can be, for example, a flexible tape or other flexible material that has conductor embedded therein. In the preferred embodiment, the flexible circuit 304 is made rigid by selectively attaching stiffeners 310 and 320 to portions of the flexible circuit 304.

Figure 4:
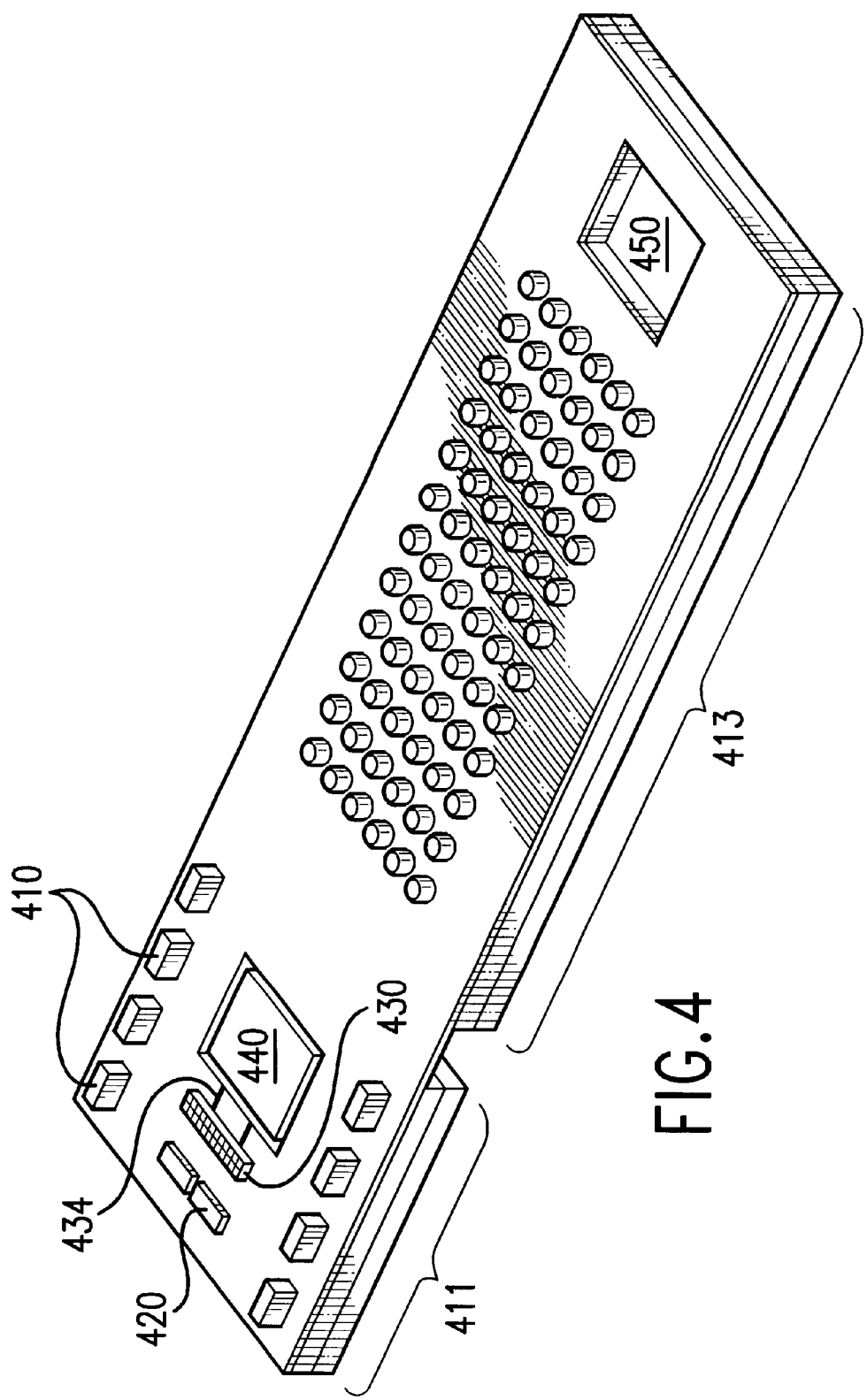
FIG. 4 is a perspective view of the substrate of FIG. 3 after assembly of optical and electrical components in accordance with one embodiment of the present invention.

Referring to FIG. 4, the packaging can include a first sub-assembly 411 and a second sub-assembly 413. The first sub-assembly 411 can include a first area (e.g., a first cavity) for receiving a first integrated circuit (e.g. driver circuit 440). The second stiffener 320 can include a second area (e.g., a second cavity) for receiving a second integrated circuit (e.g., memory circuit 450). During assembly, the first and second integrated circuits 440 and 450 can be mounted in the first area and second area, respectively.

The flexible portion 340 has a first end for mechanically and electrically coupling to the first sub-assembly 411 and a second end for mechanically and electrically coupling to the second sub-assembly 413. For example, the first stiffener 310 and second stiffener 320 can be bonded to the flexible portion.

It is noted that the size of the first stiffener 310 and the second stiffener 320 can be varied to suit a particular application. For example, the second stiffener 320 can be enlarged to include additional external circuit signal receiving areas for receiving signals from other external circuits.

In the preferred embodiment, the first sub-assembly 411 a VCSEL array and a VCSEL driver integrated circuit and the second sub-assembly 413 receives a storage integrated circuit (e.g., a nonvolatile memory circuit). The second sub-assembly 413 can include an external circuit connection area that has a plurality of connection points for coupling to an external circuit, such as an integrated circuit disposed in a router or switch. In one embodiment, the external circuit connection area has a ball grid array having a plurality of conductive balls for connection with the external circuit.

FIG. 4 is a perspective view of the substrate of FIG. 3 after assembly of optical and electrical components in accordance with one embodiment of the present invention. The substrate 300 includes passive components 410, capacitors 420, a laser array 430 (e.g., a VCSEL array having 12 lasers), a driver circuit 440 for driving the laser array 430, and a memory circuit 450 (e.g., an EEPROM). It is noted that the first sub-assembly with the first stiffener can package the VCSEL array 430 in close proximity to the VCSEL driver 440, thereby improving the electrical performance of the module. For example, wires 434 can be utilized to directed connect each of the lasers in the array 430 to the driver circuit 440.

As described in greater detail hereinafter, the packaging of the present invention allows the first sub-assembly to be bent with respect to the second sub-assembly so that 1) the laser can direct light to the fiber optic cable without the need for optics for bending the light, and at the same time 2) the second sub-assembly can electrically couple to the printed circuit board.

As noted previously, the packaging of the present invention can be used to package components of an optical receiver or optical transceiver. For example, in an optical receiver, the first sub-assembly can package an array of photo-detectors in the location of the laser array 430 and an amplifier circuit in the location of the driver circuit 440.

Figure 5:
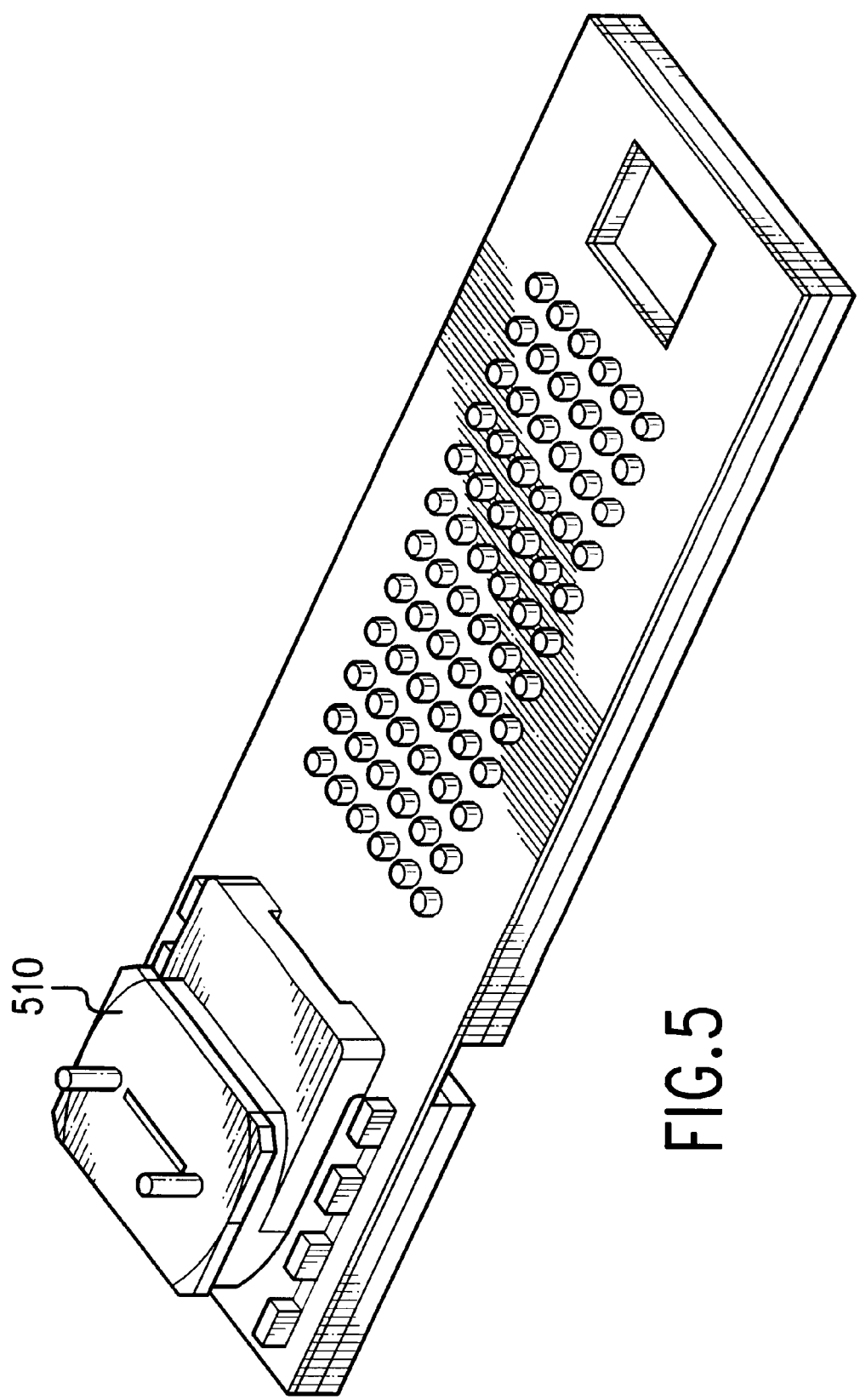
FIG. 5 is a perspective view of the sub-assembly of FIG. 3 after an optics sub-assembly has been assembled therewith in accordance with one embodiment of the present invention.

FIG. 5 is a perspective view of the sub-assembly of FIG. 3 after an optics sub-assembly 510 has been assembled therewith in accordance with one embodiment of the present invention. The optics sub-assembly 510 can include, for example, a lens (e.g., a diffractive optical element) 240 in combination with the lens alignment element 250.

Figure 6:
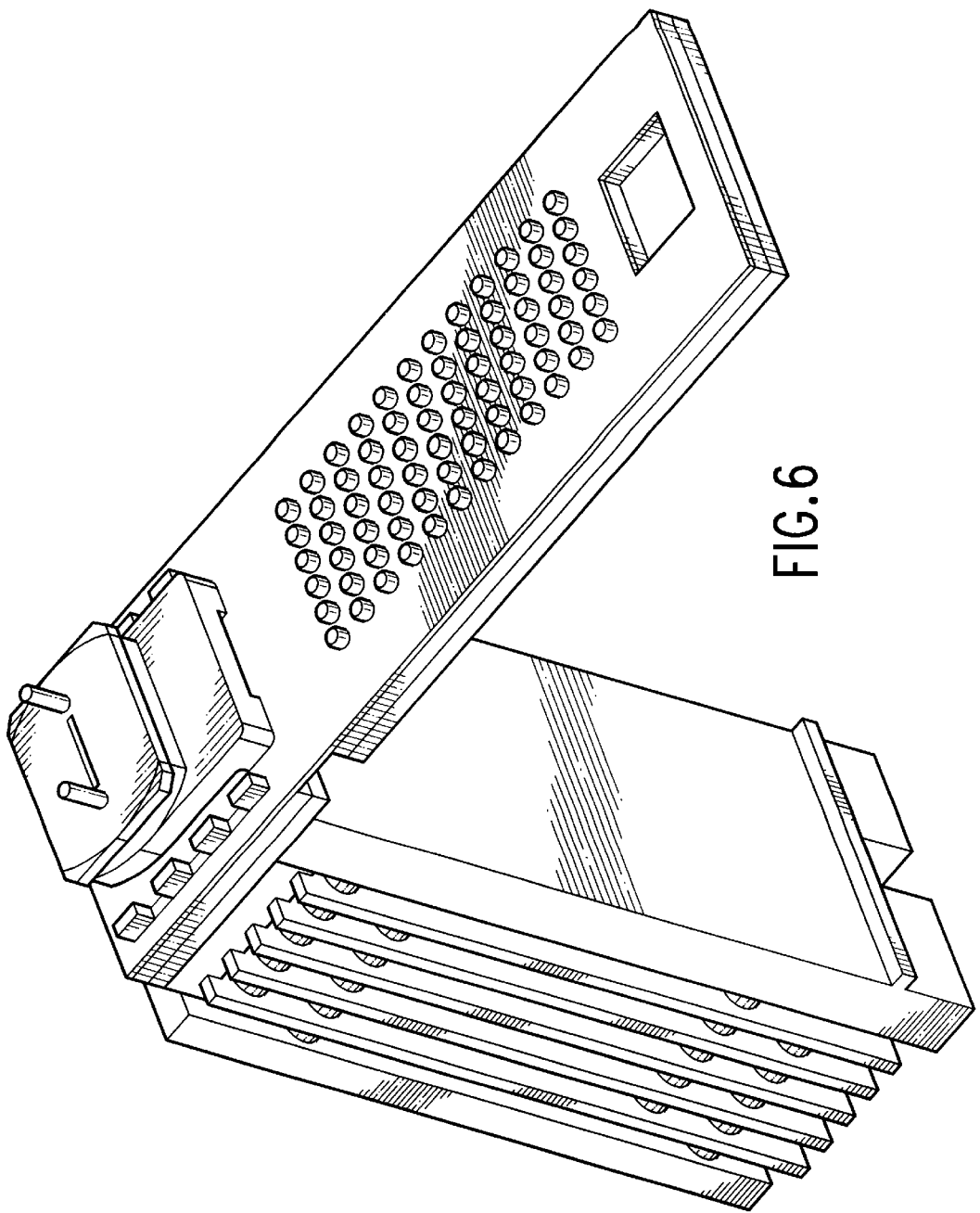
FIG. 6 is a perspective view of the sub-assembly of FIG. 5 after a first stiffener is coupled to a first surface of a heat sink in accordance with one embodiment of the present invention.
Figure 7:
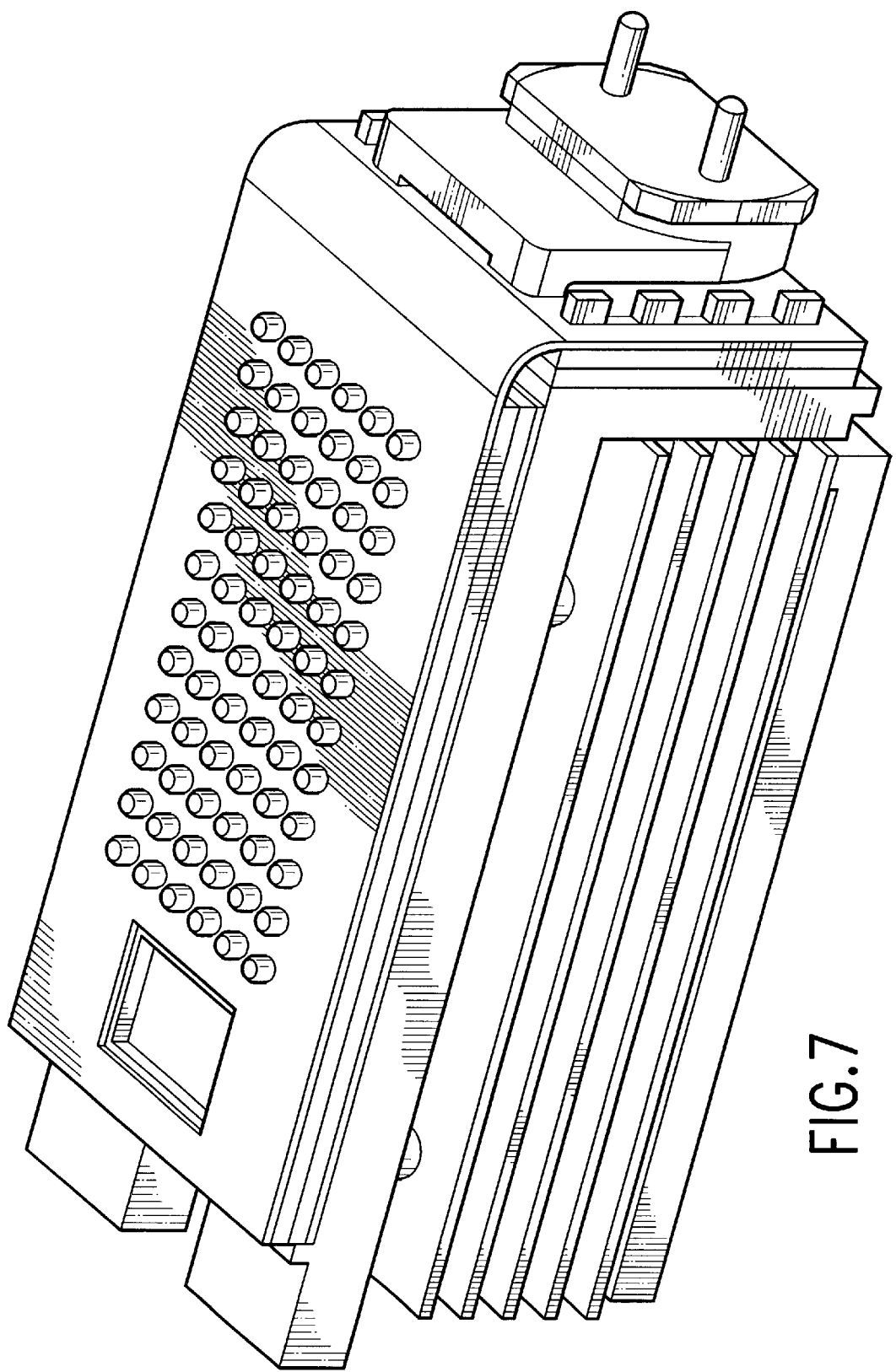
FIG. 7 is a perspective view of the sub-assembly of FIG. 6 after a second stiffener is coupled to a second surface of a heat sink in accordance with one embodiment of the present invention.

FIG. 6 is a perspective view of the sub-assembly of FIG. 5 after a first stiffener is coupled to a first surface of a heat sink 210 in accordance with one embodiment of the present invention. FIG. 7 is a perspective view of the sub-assembly of FIG. 6 after a second stiffener is coupled to a second surface of a heat sink 210 in accordance with one embodiment of the present invention. It is noted that any type of adhesive (e.g., glue or tacky material) can be used to fixably attach the stiffeners 310, 320 to the surfaces of the heat sink 210. Preferably, the adhesive is an epoxy having good heat conduction, such as silver epoxy.

Securing the stiffeners 310, 320 to the heat sink in this manner is advantageous because this arrangement simultaneously achieves two objectives: 1) orient the first sub-assembly having the laser array with respect to the second sub-assembly having the connection to the printed circuit board to form an angle of about 90 degrees; and 2) heat from the components of the sub-assembly can be effectively transferred to the heat sink 210 through the stiffeners 310, 320.

It is noted that the heat sink 210 can be in the form of other shapes (e.g., a simple block). It is further noted that another rigid body that may or may not be a heat sink can also be used to achieve the bend described above.

Figure 8:
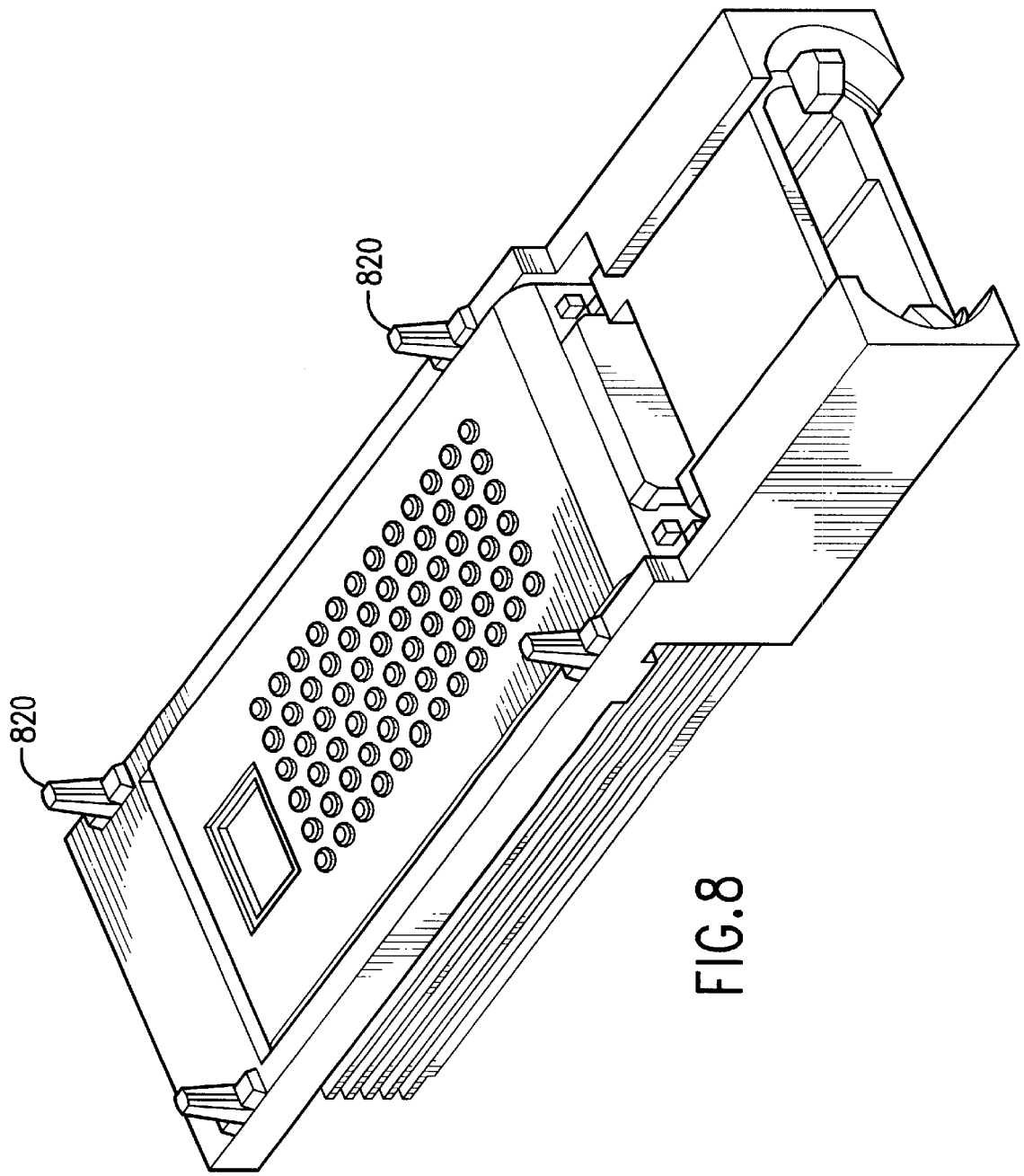
FIG. 8 is a perspective view of the sub-assembly of FIG. 7 after the sub-assembly packaging is installed into the housing and the receptacle has been positioning into the housing in accordance with one embodiment of the present invention.

FIG. 8 is a bottom perspective view of the sub-assembly of FIG. 7 after the sub-assembly packaging is installed into the housing and the receptacle has been positioning into the housing in accordance with one embodiment of the present invention. It is noted that this view illustrates that the connection portion (e.g., BGA solder bumps) can be electrically coupled to the printed circuit board. Four posts 820 are provided for threading through corresponding holes in the printed circuit board. These posts 820 provide additional mechanical support between the PCB and the sub-assembly 230.

Flexible Portion

The packaging 300 includes a flexible portion that at one time during the manufacture of the packaging can be bent or flexed to orient the first stiffener 310 with respect to the second stiffener 320 to form an angle therebetween. The flex includes a flexible layer that is made from a flexible material that can be bent without breaking. The flexible layer has a first surface and a second surface. For example, the flexible material can be polyimide material, such as Kapton™ available from Dupont Inc.

The flex also includes one or more conductive layers that are formed on either the first side or the second side of the flexible material. When more than one conductive layer is formed on one side of the flexible material, one or more vias or holes can be formed in the layers so that signals can be communicated therebetween. For example, conductive traces in a first layer can be electrically coupled to traces in a second layer through a via or hole. The number of conductive layers depends on the number electrical signals and the routing of the conductive traces. Preferably, the flexible portion has at least one electrode for coupling with a circuit or component of the networking device 100.

Processing

The steps performed to manufacture the packaging of the present invention in accordance with one embodiment of the present invention is now described. First, the first stiffener is formed from a conductive material, and the second stiffener is formed from a conductive material. This step of forming the stiffener includes the step of forming a first and second cavities, respectively, in the first and second stiffeners to receive corresponding integrated circuits. Second, a flexible material having conductive traces embedded therein and a first end and a second end is coupled to the first stiffener at the first end and to the second stiffener at the second end. Third, the first integrated circuit is electrically coupled to (e.g., wire bonded to) the first end of the flexible material, and the second integrated circuit is electrically coupled to (e.g., wire bonded to) the second end of the flexible material, thereby electrically connecting the first stiffener and the second stiffener. Fourth, the flexible material is bent to form a near ninety-degree bend. For example, the flexible material can be soldered into an L-shape.

It is noted that the angle formed by the first stiffener and the second stiffener can be varied to suit a particular application. For example, the angle between the first stiffener and the second stiffener can be between 0 to 180 degrees and between 0 and −180 degrees.

One advantage of the packaging of the present invention is that the assembly of electronic or optical components (e.g., die attachment, wire bonding, optics alignment, heat sink attachment, etc.) may be performed on the same plane (i.e., in two dimensions) rather than in three dimensions as required in the prior art. After the assembly of electronic or optical components, the sub-assembly of the present invention can be conveniently bent to suit the requirements of the specific application. In this case, the first and second stiffeners are bent with respect to each other to form an angle of about 90 degrees so that the VCSEL can transmit and receive light signals in a plane that is generally parallel to the plane of the printed circuit board without optics for bending the light signals.

Another advantage of the packaging of the present invention is that the length of the signal path between components of the first stiffener and the second stiffener is reduced, thereby increasing the electrical performance of the system and the speed of signal propagation between components.

Furthermore, the packaging of the present invention allows impedance matching to be accurately controlled. The layout of high-speed lines (e.g., data rates of about 2.5 Gigabits/s) can be controlled to improve impedance matching, thereby improving signal integrity. For example, line widths of 1.5 mils and line spacing of 3 mils are achievable. The ability to accurately specify and control the layout also reduces cross talk problems (i.e., the problem of a first signal adversely affecting adjacent signals).

In the foregoing specification, the invention has been described with reference to specific embodiments thereof. It will, however, be evident that various modifications and changes may be made thereto without departing from the broader scope of the invention. The specification and drawings are, accordingly, to be regarded in an illustrative rather than a restrictive sense.

For example, this invention has been described in the context of an optical module that is used in a networking device. However, it is to be appreciated that the flexible circuit with two stiffeners can be applied to many different applications in a wide number of different areas. The two-piece stiffener flex of the present invention is beneficial whenever it is desired or required that light be emitted in a direction that is generally parallel to a plane in which electronics related to the light emitting diode is disposed. Furthermore, the two-piece stiffener flex of the present invention is beneficial to any application where light needs to be oriented to a different orientation. It is noted that although the present invention has be described to change the orientation of light by about ninety degrees, the packaging of the present invention can flexibly accommodate other angles that are required by a particular application.

What is claimed is:

1. A packaging for use in an optical module comprising:
   a) a flexible circuit having a first portion, a second portion and a bending portion;

b) a first sub-assembly for receiving at least one optical component; wherein the first sub-assembly includes a first stiffener coupled to the first portion and an optical component receiving area;

c) a second sub-assembly for receiving at least one electrical component; wherein the second sub-assembly includes a second stiffener, a flexible circuit coupled thereto, and an electrical component receiving area; and wherein the bending portion allows the first stiffener to be oriented with respect to the second stiffener to form an angle that is between zero degrees and 180 degrees.

2. A substrate for use in an optical module comprising:

a) a flexible circuit having a first stiffener receiving area, a second stiffener receiving area and a flexible portion;

b) a first stiffener coupled to the first stiffener receiving area of the flexible circuit; and c) a second stiffener coupled to the second stiffener receiving area of the flexible circuit; wherein the flexible portion of the flexible circuit can be bent to orient the first stiffener with respect to the second stiffener to form an angle that is greater than zero degrees.

3. The packaging of claim 2 further comprising:

a first integrated circuit coupled to the first stiffener;

a second integrated circuit coupled to the second stiffener;

wherein the flexible circuit has at least one conductive trace for electrically coupling the first integrated circuit and the second integrated circuit.

4. The packaging of claim 2 wherein the flexible material is fashioned into an L shape.

5. The packaging of claim 2 wherein the optical module is one of an optical receiver, an optical transmitter, and an optical transceiver.

6. The packaging of claim 2 wherein the first stiffener and the second stiffener form an angle that is greater than zero degrees and less than 180 degrees.

7. The packaging of claim 2 wherein the first stiffener and the second stiffener form an angle of about ninety degrees.

8. An networking device comprising:

a printed circuit board having at least one integrated circuit for implementing a networking function;

at least one optical module coupled to the printed circuit board and having a packaging for integrated circuits;

the packaging having a) a flexible circuit having a first stiffener receiving area, a second stiffener receiving area and a flexible portion;

b) a first stiffener coupled to the first stiffener receiving area of the flexible circuit; and c) a second stiffener coupled to the second stiffener receiving area of the flexible circuit; wherein the flexible portion of the flexible circuit can be bent to orient the first stiffener with respect to the second stiffener to form an angle that is greater than zero degrees.

9. The networking device of claim 8 wherein the first stiffener and the second stiffener form an angle of about ninety degrees.

10. The networking device of claim 8 wherein the networking device is one of a router and switch.

* * * * *